United States Patent
Sprole, Jr. et al.

[11] Patent Number: 5,812,102
[45] Date of Patent: Sep. 22, 1998

[54] VITAL MONITORING SYSTEM FOR SEVEN-SEGMENT DISPLAY USED IN RAILROAD APPLICATIONS

[75] Inventors: Bernard J. Sprole, Jr., Cranberry Township, Butler County; David E. Cichowski, Lower Burrell, both of Pa.

[73] Assignee: Union Switch & Signal Inc., Pittsburgh, Pa.

[21] Appl. No.: 815,249

[22] Filed: Mar. 12, 1997

[51] Int. Cl.[6] .................................................. G06F 3/14
[52] U.S. Cl. ............................. 345/34; 345/46; 345/117
[58] Field of Search ............................... 345/32–54, 117, 345/207; 340/815.44

[56] References Cited

U.S. PATENT DOCUMENTS

| | | | |
|---|---|---|---|
| 3,573,814 | 4/1971 | Lang | 340/381 |
| 3,790,946 | 2/1974 | Hendricks | 340/336 |
| 4,095,217 | 6/1978 | Tani et al. | 340/324 |
| 4,242,677 | 12/1980 | Jonath | 340/715 |
| 4,247,852 | 1/1981 | Utzinger | 340/715 |
| 4,297,692 | 10/1981 | Maier | 340/715 |
| 4,311,993 | 1/1982 | Strobel | 340/641 |
| 4,408,869 | 10/1983 | Tomosada et al. | 355/14 |
| 4,420,748 | 12/1983 | Jurgen | 340/715 |
| 4,541,066 | 9/1985 | Lewandowski | 364/580 |
| 4,592,003 | 5/1986 | Kobayashi et al. | 364/579 |
| 4,644,341 | 2/1987 | Warner | 340/753 |
| 4,734,688 | 3/1988 | Adams | 340/715 |
| 4,847,606 | 7/1989 | Beiswenger | 340/712 |
| 4,951,037 | 8/1990 | Goossen | 340/715 |
| 5,160,920 | 11/1992 | Harris | 340/765 |
| 5,406,301 | 4/1995 | Ravid | 345/34 |
| 5,446,564 | 8/1995 | Mawatari et al. | 359/72 |
| 5,515,390 | 5/1996 | Benton | 371/57.1 |

*Primary Examiner*—Steven J. Saras
*Assistant Examiner*—Vincent E. Kovalick
*Attorney, Agent, or Firm*—Kevin A. Sembrat

[57] ABSTRACT

A system and method of monitoring light emitted from a light emitting diode (LED) display device, which typically has a plurality of selectively energizable display segments which are grouped to form desired shapes and/or alphanumeric characters, is provided, particularly for use in an Aspect Display Unit (ADU) that requires vitality when utilized in the railroad industry as a component of an Automatic Train Protection system utilized in the railroad industry. In a preferred embodiment, each particular segment of the LED display device is independently monitored by an accompanying independent dual photo-transistor circuit when a non-vital output periodically drives each segment to a known electrical state and then back to the original state. A first and a second photo-transistor is used for each segment of the LED display. Each segment and the accompanying first and second phototransistor is surrounded by a shield which prevents light from other segments from being detected by the particular first and second photo-transistor. The first photo-transistor is directed toward the particular segment to sense light emitted therefrom and ambient light thereabout, while the second photo-transistor is directed away from the particular segment sense only ambient light thereabout that segment. The first and second phototransistors generate electrical signals which are representative of the light detected by each of the first and second photo-transistors. The generated electrical signals drive a monitoring circuit which generates error signals representative of malfunctioning LED display segments, based on a comparison to a fixed voltage of a difference in voltages provided from the first and second photo-transistors.

20 Claims, 5 Drawing Sheets

VITAL MONITORING SYSTEM FOR SEVEN-SEGMENT DISPLAY USED IN RAILROAD APPLICATIONS

BACKGROUND OF THE INVENTION

1. Field of the Invention

The present invention relates generally to displays which utilize a plurality of individually energizable segments to form a digit or other symbol and, more particularly, to a system and method for monitoring the fail safe operation of such displays when utilized in the railroad industry.

2. Description of the Related Art

In the related art, monitoring of segment type indicators is particularly important, since failure of a particular segment may result in a false indication which may not be recognizable as such. In the case of light/emitting diodes (LEDs), the solution to this problem has been to monitor voltage across and the current flowing through the segments. For liquid crystal displays (LCDs) such a method is not practical, since the currents to be monitored are very small.

Figure 1:
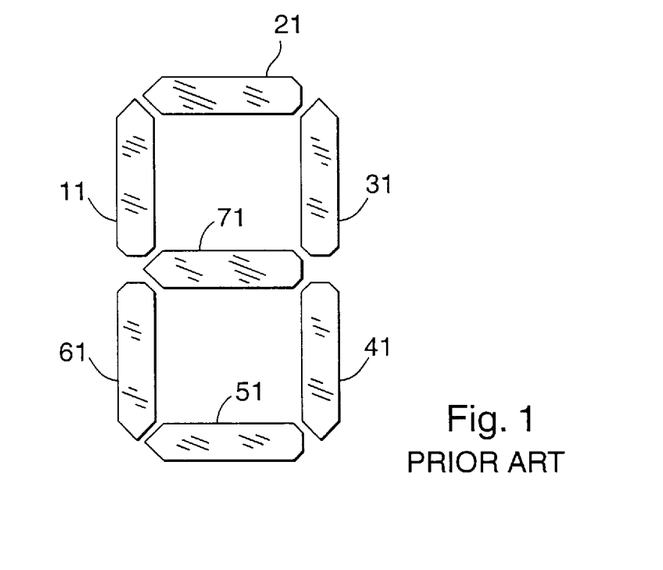
FIG. 1 is a top view of a typical light emitting diode seven-segment display with the segments arranged to display various shapes and/or alphanumeric characters, in accordance with the prior art.
Figure 2:
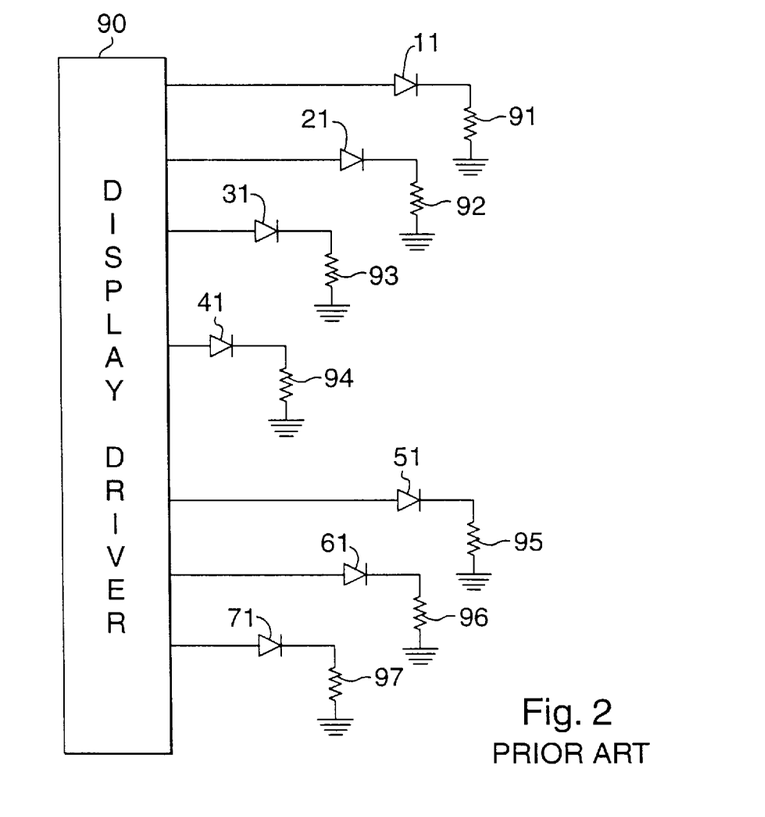
FIG. 2 shows a circuit diagram of a typical display driver which selectively and separately drives seven independent light emitting diodes, in accordance with the prior art.

Referring now to FIGS. 1 and 2, a seven-segment LED display 1 typically comprises segments 11, 21, 31, 41, 51, 61 and 71 which are selectively and independently driven by a display driver 90, in accordance with the prior art. As shown in FIG. 2, diode segments 11, 21, 31, 41, 51, 61 and 71 are typically independently coupled between the display driver 90 and electrical ground through respective current-limiting resistors 91, 92, 93, 94, 95, 96 and 97. Although only one seven-segment display is shown in FIGS. 1 and 2, it is understood that a plurality of seven-segment displays may be arranged adjacent to each other in a manner known in the art, thereby to display a plurality of alphanumeric characters and/or shapes.

In the railroad industry, "vital" is a term applied to a product or system that performs a function that is critical to safety, while "non-vital" is a term applied to a product or system that performs a function that is not critical to safety. Additionally, "fail-safe" is a design principle in which the objective is to eliminate the hazardous effects of hardware or software faults, usually by ensuring that the product or the system reverts to a state known to be safe.

In the railroad industry, one of the components which is included within an Automatic Train Protection (ATP) system is an Aspect Display Unit (ADU). The ATP receives signals from the rails which indicate the current maximum allowable speed at which the locomotive can proceed. The ATP can then indicate this speed to the operator by controlling lights, called aspects, on the ADU which is typically located between the two front windows or in the dash.

In many systems, the ADU is a non-vital element, that is, not safety critical, since the ATP will keep the locomotive operating at or below the maximum allowable speed at all times by removing pressure from the brake system, thereby applying emergency brakes. In some systems, however, the ADU is a vital element since the ability of the system to control the brakes is either not available or can be selectively bypassed. The aspects are normally bulbs or blocks of LEDs which can be controlled using "vital outputs" whose failure modes result in removing voltage from across the LEDs. Conceptually, removing voltage from across the LEDs is easy to do since removing power ensures that the aspects will be dark, which has the same meaning as a zero mile-per-hour (MPH) allowable speed indication. Additionally, if the bulb or LEDs fail or burn out, the aspect will go dark and thereby provide a safe zero MPH allowable speed indication.

As is known in the art, the problem with a seven-segment LED display is that if one segment were to fail or to be turned off inadvertently, the displayed allowable speed shown could actually increase in value. For instance, if 80 MPH is the intended speed to be displayed with two seven-segment displays, and the left bottom element in the seven-segment display for the eight fails or is turned off, the seven-segment display would show a 9 instead of an 8 and the speed shown would become 90 MPH instead of the intended 80 MPH. In other words, if a segment or its connection is damaged, a wrong number could be displayed. For example, an "8" could be displayed as a "6", "0", or a "9". For this reason, the fact that the output driving a particular LED is in the "on" state does not necessarily indicate that the LED is emitting light and showing a correct display.

U.S. Pat. No. 4,734,688 issued in the name of Adams describes an LCD system in which malfunction in the drive circuit causes one or more segments of the display to flicker. Each segment of the display is driven by a drive circuit and a test circuit. The drive circuit generates a strong drive signal which is applied to a display segment. The test circuit generates a weak checking signal which is superimposed on the strong signal. The weak signal has no discernible effect on the display segments so long as the strong signal is present. However, any defect in the drive circuit or between the drive circuit and the contact to the display segment suppresses the strong signal and allows the weak signal to be discerned in the form of a flicker and the relevant segment electrode. The patent does not detect failures in the display segments.

U.S. Pat. No. 4,311,993, issued in the name of Strobel, describes an LCD system having circuits which use the capacitive properties of the segments to indicate malfunctioning of the segments.

U.S. Pat. No. 5,160,920, issued in the name of Harris, describes a segmented LCD which is energized to transmit light through selected ones of its display segments to segmented photovoltaic cells disposed beneath the LCD. The photovoltaic cells become the background for the segmented LCD. Each segment of the display coacts with a separate one of the photovoltaic cells. The voltage that is developed by each photovoltaic cell is proportional to the amount of light which it receives from a related display segment. When the segment is energized, ambient light is allowed to pass through the segment to generate a voltage by the photovoltaic cell located there beneath. The generated voltage is compared with a secondary voltage generated by additional photovoltaic cells positioned below the non-segmented section of the display. As such, the invention claimed by this reference monitors LCD segments by comparing a first voltage against a second voltage that is generated by ambient light located away from the monitored segment. As a result, the invention claimed by this reference will not monitor properly when ambient light is non-existent away from the segment, such as when a train is passing through a tunnel. Moreover, the invention claimed by this reference monitors liquid crystal displays rather than light emitting diode displays, which may be preferable in situations where ambient light may be low or non-existent. Additionally, the geometry of light emitting diode displays is not conducive to layering described by this invention. Further, the invention claimed by this reference does not force a state change of known states of each segment, thereby to monitor and to detect a fault occurring within each period.

Consequently, a need has been felt for providing a system and method which overcomes the problem of monitoring a seven-segment display of the light emitting diode (LED) style with a periodic check of each segment, thereby to detect a failure of a segment within a predetermined period, particularly in railroad applications requiring fail-safe operations.

SUMMARY OF THE INVENTION

It is therefore an object of the present invention to provide a vital aspect display unit (ADU) of the light-emitting diode style, to be used with an automatic train protection (ATP) system in the railroad industry.

It is another object of the present invention to provide fail-safe features in the ADU.

It is another object of the present invention to provide a seven-segment LED display with a novel structure.

It is a feature of the present invention to monitor each segment of the seven-segment LED display independently by sensing light emitted and ambient to each particular segment when each particular segment is periodically forced to a known electrical state.

Briefly described according to one embodiment of the present invention, a non-vital output drives each particular segment of the LED display to a known electrical state while each particular segment is monitored independently by an accompanying dual photo-transistor circuit. A first and a second photo-transistor is used for each segment of the seven segment LED display. Each segment and the accompanying first and second phototransistor is surrounded by a shield which prevents light from other segments from being detected by the particular first and second photo-transistor. The first photo-transistor is directed toward the particular segment to sense light emitted therefrom and ambient light thereabout, while the second photo-transistor is directed away from the particular segment to sense only ambient light. In this manner, the first and second photo-transistors are both sensitive to ambient light emanating within the particular shield about the segment but the first phototransistor is more sensitive to light from the segment than is the second photo-transistor which is directed away from the segment. The first and second photo-transistors generate electrical signals which are representative of the light detected by each of the first and second photo-transistors. The generated electrical signals drive a differential amplifier circuit which outputs the difference (ΔPT) between the first and second photo-transistor output voltages. ΔPT is then compared to a fixed constant voltage, thereby to generate error signals representative of malfunctioning LED display segments.

An advantage of the present invention is that LED display units may be monitored for vital fail-safe conditions.

Another advantage of the present invention is that the monitoring system for LED segments operates without regard to the presence of ambient light.

Another advantage of the present invention is that the monitoring system determines whether light is actually being emitted by each segment of the LED display when light is expected to be emitted.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

DESCRIPTION OF THE PREFERRED EMBODIMENTS

1. Detailed Description of the Figures

Figure 3:
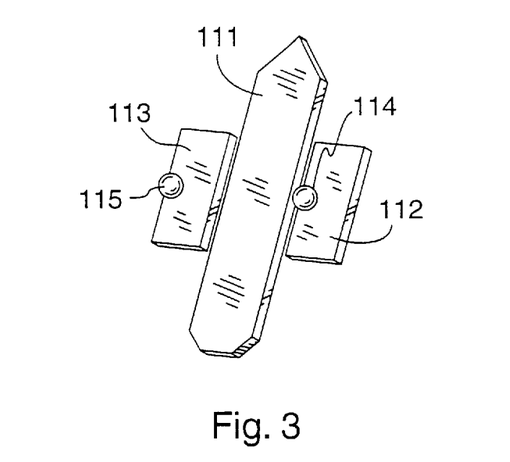
FIG. 3 is a top perspective view of a single light emitting diode segment from FIG. 1 with a first and a second photo-transistor arranged relative to the light emitting diode segment to detect light in accordance with a preferred embodiment of the present invention.

In accordance with a preferred embodiment of the present invention, FIG. 3 shows a top perspective view of a light emitting diode segment 111 positioned between a primary photo-transistor 112 and an ambient photo-transistor 113. The primary photo-transistor 112 is positioned adjacent the light emitting diode segment 111 such that a light sensor 114 is directed toward the light emitting segment 111, thereby to receive light emitted from the segment 111. The ambient photo-transistor 113 is positioned adjacent an opposing side of the segment 111 such that a light sensor 115 is directed away from the segment 111, thereby to minimize the receipt of light emitted from the segment 111, but to sense ambient light about the segment 111.

Figure 4:
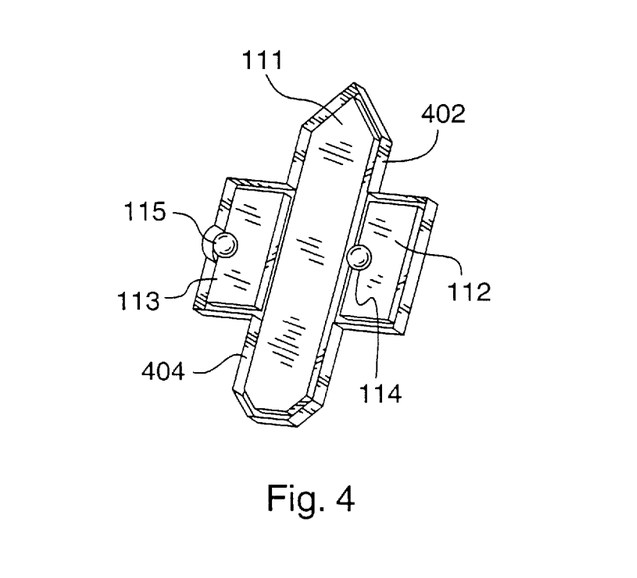
FIG. 4 is a top perspective view of the light emitting diode segment and photo-transistors of FIG. 3 being surrounded by a light-preventive shield in accordance with a preferred embodiment of the present invention.

FIG. 4 shows a perspective view of a shield 402 built about and around a perimeter of the segment 111 and photo-transistors 112,113 of FIG. 3. In a preferred embodiment, the shield 402 is manufactured of a water-jet cut opaque non-metallic material, such as a plastic component, for instance, thereby to absorb light and minimize reflection therefrom. In another preferred embodiment, the shield is cut by a laser or other suitable cutting means. In a preferred embodiment the shield 402 is placed in close proximity to the segment 111 and the photo-transistors 112, 113 thereby to shield the segment 111 and photo-transistors 112, 113 within a minimal defined area 404. This shield 402 is intended to prevent light external to the shield from entering therewithin, thereby to permit light emitted within the area 404 to be sensed only by the light sensors 114, 115. In a preferred embodiment, a cover (not shown) is placed over a plurality of segments. The cover permits light to exit therethrough from the defined area 404.

Figure 5:
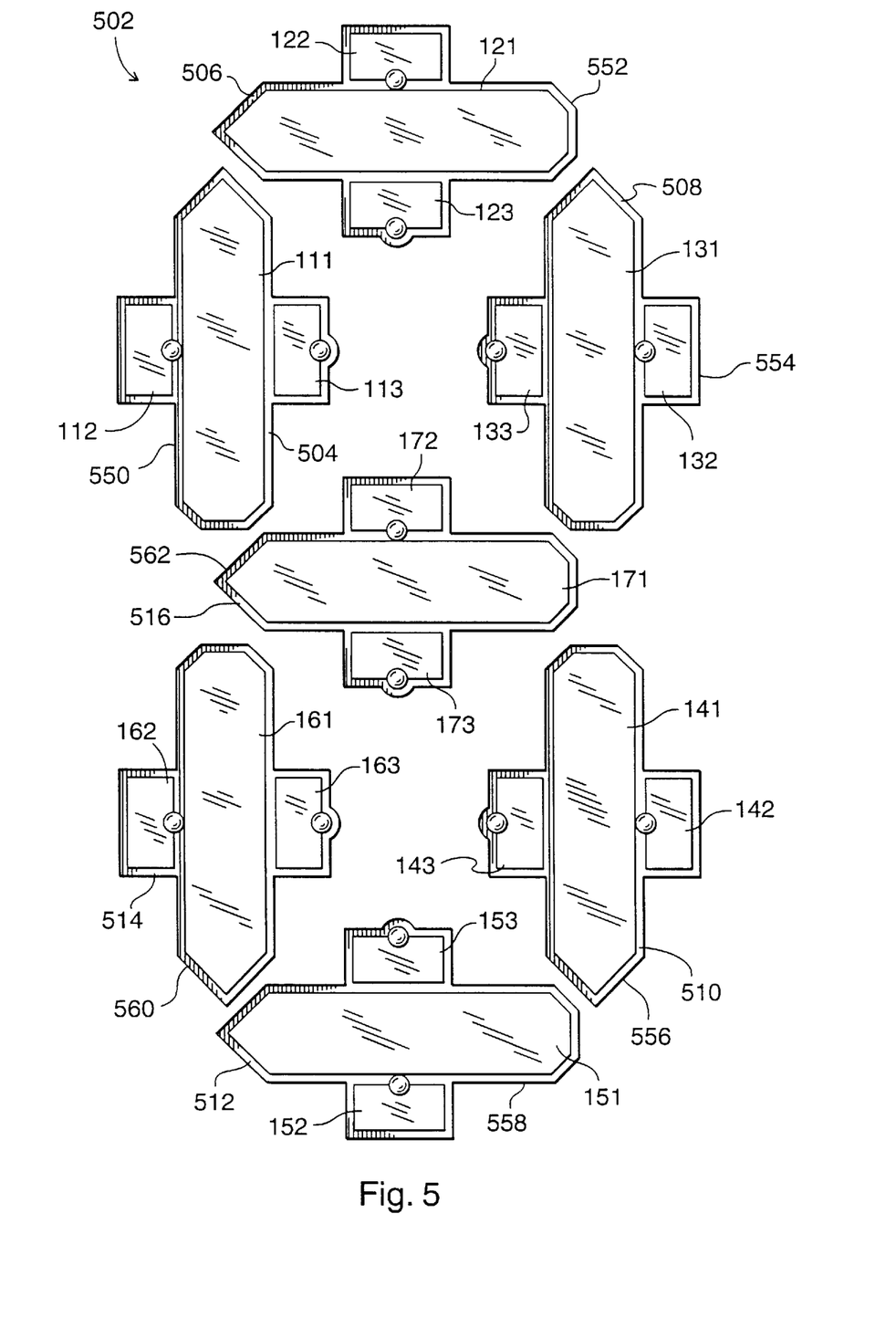
FIG. 5 is a top view of the seven-segment display of FIG. 1 with each individual segment provided with a first and second transistor and light preventive shield in accordance with a preferred embodiment of the present invention.

FIG. 5 shows a top view of a seven-segment display 502 with each segment 111, 121, 131, 141, 151, 161 and 171 having respective primary photo-transistors 112, 122, 132, 142, 152, 162, 172 and respective ambient photo-transistors 113, 123, 133, 143, 153, 163, 173 enclosed within a respective independent defined area 504, 506, 508, 510, 512, 514, 516 by a respective shield 550, 552, 554, 556, 558, 560, 562, in accordance with a preferred embodiment of the present invention.

Figure 6:
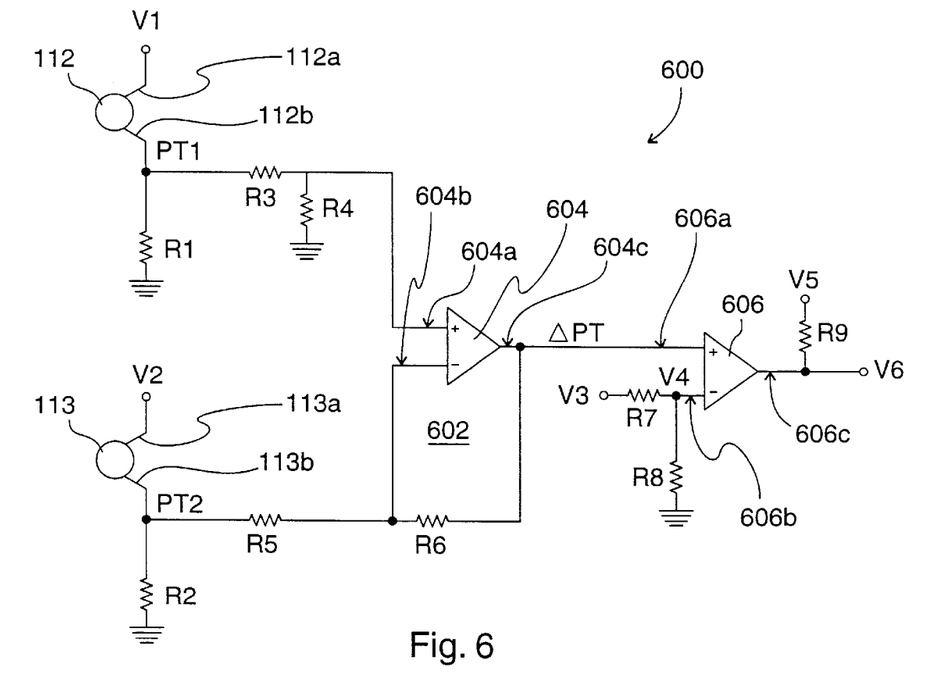
FIG. 6 is a circuit diagram which monitors a particular light emitting diode segment in accordance with a preferred embodiment of the present invention.

FIG. 6 shows a schematic diagram of a preferred embodiment of a monitoring circuit 600 that is used to monitor an output voltage PT1 and PT2 from the primary phototransistor 112 and the ambient phototransistor 113, respectively. Although the monitoring circuit 600 is shown only for the phototransistors 112, 113 that are monitoring the segment 111, it is understood that a similar monitoring circuit is provided for monitoring each other segment in the seven-segment display 502, for instance.

A terminal 112a of the primary phototransistor 112 is electrically coupled to a power supply V1 that provides a suitable source of d.c. voltage. In a preferred embodiment, the power supply V1 provides +5 volts. A load resistor R1 is electrically coupled between a terminal 112b of the primary phototransistor 112 and electrical ground, thereby to define an output voltage PT1 at the terminal 112b. In a preferred embodiment, the resistor R1 has a resistance of 20K Ohms, although one skilled in the art will recognize other resistance values relative to the power supply V1.

Similarly, a terminal 113a of the ambient phototransistor 113 is electrically coupled to a power supply V2 that provides a suitable source of d.c. voltage. In a preferred embodiment, the power supply V2 provides +5 volts. A load resistor R2 is electrically coupled between a terminal 113b of the ambient phototransistor 113 and electrical ground, thereby to define an output voltage PT2 at the terminal 113b. In a preferred embodiment, the resistor R2 has a resistance of 20K Ohms, although one skilled in the art will recognize other resistance values relative to the power supply V2.

A differential amplifier circuit 602 (also known in the art as a subtractor or a common-mode circuit), which comprises an operational amplifier 604, and resistors R3, R4, R5 and R6, is electrically coupled to the terminals 112b and 113b such that the output voltage PT1 is provided at a non-inverting input 604a, and the output voltage PT2 is provided at an inverting input 604b. A preferred embodiment of the operational amplifier 604 is a standard operational amplifier, Model No. LM124, LM224, or LM324, for instance, manufactured by National Semiconductor of Santa Clara, Calif., U.S.A. The resistors R3, R4, R5 and R6 typically have the same resistance value, preferably 10K Ohms in the present invention, and they are connected as shown to provide a standard differential amplifier circuit, as is known in the art. In this manner, the differential amplifier circuit 602 provides a gain ΔPT that is equal to the difference between the output voltage PT1 and the output voltage PT2. This difference may be expressed as the mathematical equation: ΔPT=PT1−PT2, as is known in the art. The gain ΔPT is provided at an output 604c, which is electrically coupled to a non-inverting input 606a of a comparator 606. As known in the art, the comparator 606 has the non-inverting input 606a, an inverting input 606b, and an output 606c. A preferred embodiment of the comparator 606 is a standard operational amplifier, Model No. LM139, manufactured by Motorola Inc. of Schaumburg, Ill., U.S.A.

A load resistor R7 is electrically coupled between the inverting input 606b and a power supply V3 that provides a suitable source of d.c. voltage. A resistor R8, electrically coupled between the inverting input 606b and electrical ground, operates with the resistor R7 as a voltage divider as is known in the art, thereby to define a fixed voltage V4 supplied to the inverting input 606b. The voltage V4 provided is dependent on the LED size, color, and type, for instance, but in a preferred embodiment, the voltage V4 is 0.83 volts.

In a preferred embodiment, the reference voltage V3 provides +5 volts, the resistor R7 has a resistance of 10K Ohms, and the resistor R8 has a resistance of 2K Ohms, thereby to provide a suitable fixed voltage V4 at the inverting input 606b of the comparator 606. A resistor R9, preferably 1K Ohm, is electrically coupled between the output 606c and a power supply V5, which preferably provides +5 volts.

In this manner, as is known in the comparator art, the comparator 606 is used as a level detector, wherein the output 606c provides an output voltage V6 in the "1" or "on" state when the gain ΔPT is compared to the fixed voltage V4 and is greater than the fixed voltage V4, and wherein the output 606c provides an output voltage V6 in the "0" or "off" state when the gain ΔPT is compared to the fixed voltage V4 and is less than the fixed voltage V4.

Figure 7:
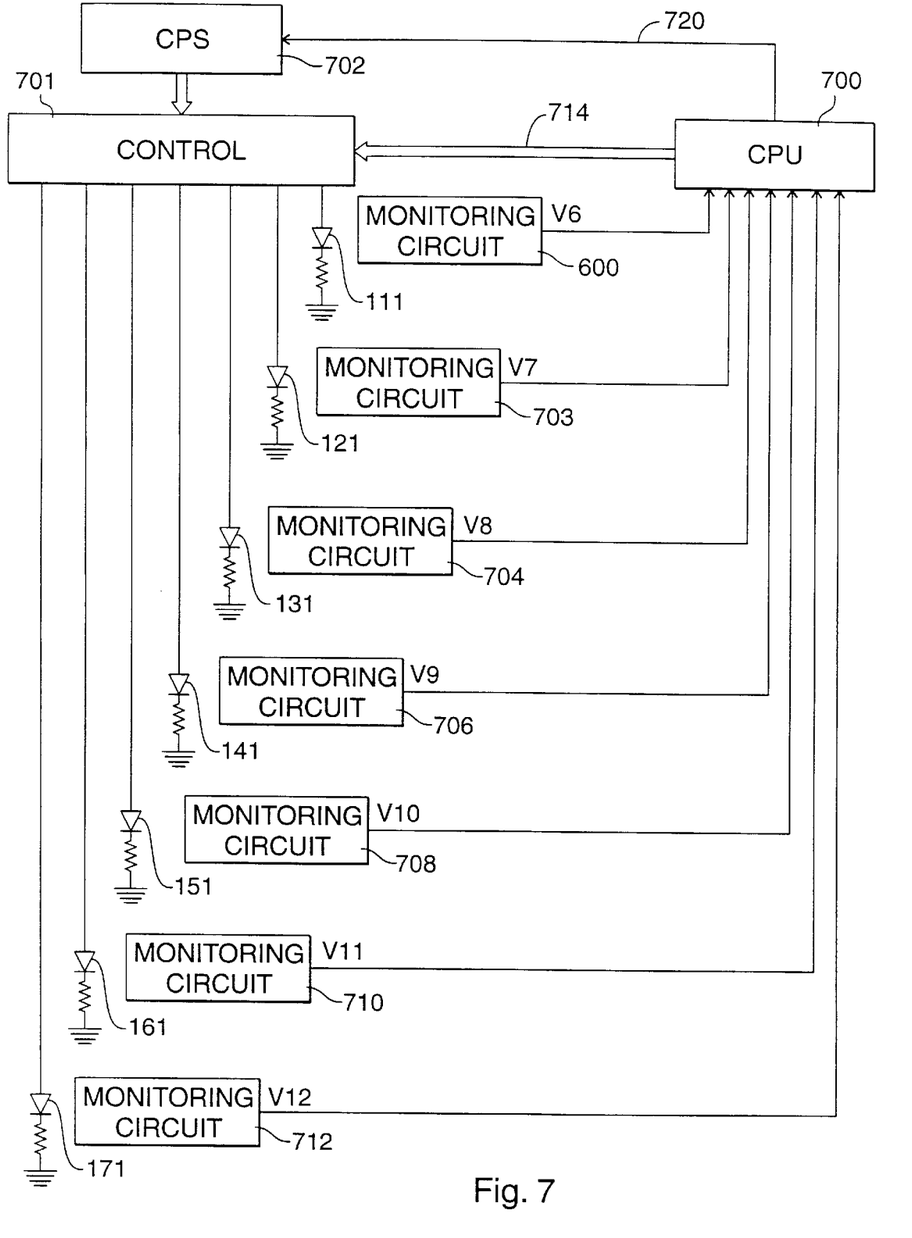
FIG. 7 is a functional block diagram of a preferred embodiment of the present invention wherein a central processing unit (CPU) operates a control block and a conditional power supply (CPS) based on a closed monitoring test loop which provides feedback from each independently monitored segment.

FIG. 7 is a functional block diagram of a preferred embodiment of the present invention. A central processing unit (CPU) 700 operates a control block 701 and a conditional power supply (CPS) 702 based on a closed monitoring test loop which provides feedback from each independently monitored segment. The CPU 700 receives as feedback output voltages V6, V7, V8, V9, V10, V11 and V12, respectively supplied from monitoring circuits 600, 703, 704, 706, 708, 710 and 712, which monitor respective segments 111, 121, 131, 141, 151, 161 and 171. The CPU 700 generates a conditional signal 720 that is required in order for the CPS 702 to provide power to the control block 701. In a preferred embodiment, the conditional signal 720 is a square wave with frequency of about 500 Hertz. The CPU also generates display data (not shown) through a bus 714 to the control block 701 which independently drives each of the segments 111, 121, 131, 141, 151, 161 and 171.

In a preferred embodiment, the CPS 702 is a vital conditional power supply that is designed as a fail-safe hardware component which receives input from a battery (not shown) and the conditional signal 720 from the CPU 700, preferably via dedicated hardware (not shown). The control block 701 switches the display data received through the bus 714 to the segments 111, 121, 131, 141, 151, 161 and 171 as long as the CPU 700 provides the conditional signal 720 to the CPS 702, thereby to indicate that the segments are operating properly based on feedback received from each monitoring circuit of each respective segment. The conditional signal 720 provided by the CPU 700 verifies that a fault-free condition was determined by the CPU 700 and that each segment is functioning properly based on feedback received from each respective monitoring circuit. If the CPU 700 stops providing the conditional signal 720, thereby indicating that the segments are not operating properly, then the CPS 702 stops supplying power to the control block 701 and therefore to each segment, thereby forcing all segments to the fail-safe condition of not emitting light. When all segments are dark and do not emit light, then the Aspect Display Unit is not emitting an incorrect display that may otherwise be unsafe.

2. Operation of the Preferred Embodiment

In operation, each segment 111, 121, 131, 141, 151, 161, 171 is independently and selectively energizable to an energized (on) state wherein the segment emits light, and to a non-energized (off) state wherein the segment does not emit light. FIG. 6 shows a schematic diagram of a dual photo-transistor circuit 602 which rejects ambient light and drives a non-vital input which is then monitored by a processing unit (not shown) in order to close the test loop. It is understood that the primary photo-transistor 112 and the ambient photo-transistor 113 and related circuitry shown in FIG. 6 correspond to the monitoring circuitry for segment 111 and that each other segments, 121, 131, 141, 151, 161, 171 each have a separate circuit which is similar to that in FIG. 6 but not shown. As mentioned, two photo-transistors are used for each segment. The primary photo-transistor 112 is directed towards the segment 111 and the ambient photo-transistor 113 is directed away from the segment 111. The photo-transistors 112, 113 are both sensitive to ambient light, but the primary photo-transistor 112 is much more sensitive to the segment 111 than is the ambient photo-transistor 113. A differential op-amp circuit 602 outputs the difference between the output voltages of the primary photo-transistor 112 and the ambient photo-transistor 113.

For vitality in operation, each segment is subjected to a "flip" test wherein each segment is independently switched from its current "on" or "off" state to the opposite "off" or "on" state, preferably for about 1 microsecond, and then returned to its current "on" or "off" state. During the period that each segment is independently switched to its opposite state, each of the primary and ambient phototransistors will sense light emanating within each area defined by each shield supplied for each segment, and each monitoring circuit provided for each segment will provide to the central processing unit a respective output that is representative of a malfunctioning segment, based upon the comparison to the fixed voltage of the difference between the voltages provided by the primary and ambient phototransistor that is sensing light for each segment. In this manner, each particular segment is monitored relative to ambient light that is associated with each particular segment that emits or does not emit light, rather than relative to ambient light that is generally available to all of the plurality of segments. As such, each segment is independently monitored and tested without regard to whether ambient light is sensed, because any ambient light is sensed by both the primary and ambient phototransistors and then subtracted out before comparison to a fixed voltage. This test is provided periodically, preferably once per second, thereby to provide a closed loop test in order to provide an early fault detection so that corrective action, such as removing power supplied to the segments, may be taken immediately upon detection of a fault.

The foregoing description of the preferred embodiment of the present invention has been presented for purposes of illustration and description. It is not intended to be exhaustive or to limit the present invention to the precise form disclosed, and obviously many modifications and variations are possible in light of the above teachings. For instance, other light emitting sources, such as incandescent bulbs or fiber optic displays, for instance, would be feasible in light of the above teachings. In addition, it is understood that the CPU 700 and the control block 701, for instance, may provide inputs to, and receive outputs from, other components not shown in the above teachings.

The preferred embodiment was chosen and described in order to best explain the principles of the present invention and its practical application to those persons skilled in the art, and thereby to enable those persons skilled in the art to best utilize the present invention in various embodiments and with various modifications as are suited to the particular use contemplated. It is intended that the scope of the present invention be broadly defined by the claims which follow.

What is claimed is:

1. A monitoring system for a display unit carrying a plurality of selectively energizable light-emitting segments, each segment having an energized and a non-energized state, wherein said light emitting segments emit light in said energized state, and wherein said monitoring system comprises:

first photovoltaic means directed toward each segment of the plurality of light emitting segments, for generating a primary electrical signal upon detection of light emitted from each segment of said light emitting segments;

second photovoltaic means directed away from each segment of the plurality of light emitting segments, for generating a secondary electrical signal upon detection of ambient light;

shielding means for surrounding each segment of the plurality of light emitting segments and said first and second photovoltaic means of each segment of the plurality of light emitting segments, such that only light emanating within said shielding means is detectable by said first and second photovoltaic means;

monitoring means for generating a comparison signal for each segment of the plurality of light emitting segments, wherein said comparison signal is representative of a comparison between a predetermined reference voltage and a voltage difference between said primary electrical signal and said secondary signal of each segment of the plurality of light emitting segments;

conditional energizing means electrically coupled to each segment of the plurality of light emitting segments for conditionally energizing each segment of the plurality of light emitting segments;

processing means for receiving and processing said comparison signal and generating display data and an energizing signal to operate said conditional energizing means when said comparison signal of each segment confirms that each segment is operating fault-free; and control means electrically coupled to said conditional energizing means and said processing means for selectively gating said display data from said processing means to each segment of the plurality of light emitting segments.

2. The system according to claim 1, wherein said processing means cooperates with said conditional energizing means to switch each segment in said energized state to said non-energized state for a predetermined period and then back to said energized state, and to switch each segment in said non-energized state to said energized state for said predetermined period and then back to said non-energized state, during said predetermined period said monitoring means generates said comparison signal for each segment of the plurality of light-emitting segments.

3. The system according to claim 2, wherein each segment of the plurality of light-emitting segments is switched periodically.

4. The system according to claim 2, wherein each segment of the plurality of light-emitting segments is switched about once per second.

5. The system according to claim 3, wherein said predetermined period is about one microsecond.

6. The system according to claim 4, wherein said predetermined period is about one microsecond.

7. The system according to claim 1, wherein said processing means cooperates with said conditional energizing means to switch each segment in said energized state to said non-energized state for a first predetermined period and then back to said energized state, and to switch each segment in said non-energized state to said energized state for a second predetermined period that is different than said first predetermined period, and then back to said non-energized state, during said first and second predetermined periods, respectively, said monitoring means generates said comparison signal for each segment of the plurality of light-emitting segments.

8. The system according to claim 7, wherein each segment of the plurality of light-emitting segments is switched periodically.

9. The system according to claim 7, wherein each segment of the plurality of light-emitting segments is switched about once per second.

10. The system according to claim 8, wherein said predetermined period is about one microsecond.

11. The system according to claim 9, wherein said predetermined period is about one microsecond.

12. A monitoring system for a display unit carrying a plurality of selectively energizable light-emitting segments, each segment having an energized and a non-energized state, wherein light emitting segments are grouped to form desired shapes and/or alphanumeric characters when emitting light in the energized state, and wherein said monitoring system comprises:

first and second photovoltaic means for generating a primary and a secondary electrical signal that has a first and a second voltage and is representative of light detected, respectively, wherein said first photovoltaic means is directed toward each segment of the plurality of light emitting segments to detect light emitted therefrom and ambient light thereabout, and wherein said second photovoltaic means is directed away from each segment of the plurality of light emitting segments to detect ambient light thereabout while minimizing detection of light emitted therefrom;

shielding means for surrounding each segment of the plurality of light emitting segments and said first and second photovoltaic means of each segment of the plurality of light emitting segments, such that only light emanating within said shielding means is detectable by said first and second photovoltaic means of each segment of the plurality of light emitting segments;

monitoring means for generating a comparison signal for each segment of the plurality of light emitting segments, wherein said comparison signal is representative of a comparison between a predetermined reference voltage and a voltage difference between said first and second voltage of each segment of the plurality of light emitting segments;

conditional energizing means electrically coupled to each segment of the plurality of light emitting segments for conditionally energizing each segment of the plurality of light emitting segments; and processing means for receiving and processing said comparison signal and generating display data and an energizing signal to operate said conditional energizing means when said comparison signal of each segment confirms that each segment is operating fault-free, wherein said display data is selectively gated from said processing means to each segment of the plurality of light emitting segments.

13. The system according to claim 12, wherein said processing means cooperates with said conditional energizing means to switch each segment in said energized state to said non-energized state for a predetermined period and then back to said energized state, and to switch each segment in said non-energized state to said energized state for said predetermined period and then back to said non-energized state, during said predetermined period said monitoring means generates said comparison signal for each segment of the plurality of light-emitting segments.

14. The system according to claim 13, wherein each segment of the plurality of light-emitting segments is switched periodically.

15. The system according to claim 13, wherein each segment of the plurality of light-emitting segments is switched about once per second.

16. The system according to claim 14, wherein said predetermined period is about one microsecond.

17. The system according to claim 15, wherein said predetermined period is about one microsecond.

18. A method of monitoring a light emitting display device carrying a plurality of selectively energizable display segments which are grouped to form desired shapes and/or alphanumeric characters, wherein the method comprises the steps of:

a) de-energizing, for a predetermined period of time, each segment of said plurality of display segments that is in an energized state and energizing, for said predetermined period of time, each segment of said plurality of display segments that is in a de-energized state;

b) after said predetermined period of time, re-energizing each of said plurality of display segments that has been de-energized and de-energizing each of said plurality of display segments that has been energized; and c) removing a power supply signal upon detection of a malfunctioning display segment for each of said plurality of display segments, thereby to de-energize said plurality of display segments when a segment malfunctions.

19. The method according to claim 18, further comprising the following step before step a):

d) surrounding each segment of said plurality of display segments with a light shield.

20. A method of monitoring a light emitting display device carrying a plurality of selectively energizable display segments which are grouped to form desired shapes and/or alphanumeric characters, wherein the method comprises the steps of:

a) surrounding each segment of said plurality of display segments with a light shield;

b) de-energizing each segment of said plurality of display segments that is in an energized state and energizing each segment of said plurality of display segments that are in a de-energized state;

c) generating a primary electrical signal with a first voltage that represents detection of ambient light about and light emitted from each segment of said plurality of display segments, while simultaneously generating a secondary electrical signal with a second voltage that represents detection of ambient light about each segment of said plurality of display segments and within said light shield for each of said plurality of display segments;

d) generating a comparison signal that is representative of a comparison between a predetermined reference voltage and a difference between said first and second voltage for each segment of said plurality of display segments;

e) re-energizing each of said plurality of display segments that is in said de-energized state and de-energizing each of said plurality of display segments that are in an energized state; and f) removing a power supply signal upon detection of a malfunctioning display segment for each of said plurality of display segments, thereby to de-energize said plurality of display segments when a segment malfunctions.

* * * * *